(12) United States Patent
Tseng et al.

(10) Patent No.: US 12,477,746 B2
(45) Date of Patent: Nov. 18, 2025

(54) METHOD OF FORMING MEMORY CELL

(71) Applicant: Taiwan Semiconductor Manufacturing Company, Ltd., Hsin-Chu (TW)

(72) Inventors: Yuan-Tai Tseng, Zhubei (TW); Chung-Chiang Min, Zhubei (TW); Shih-Chang Liu, Alian Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 653 days.

(21) Appl. No.: 17/836,092

(22) Filed: Jun. 9, 2022

(65) Prior Publication Data

US 2022/0302209 A1    Sep. 22, 2022

Related U.S. Application Data

(63) Continuation of application No. 17/389,774, filed on Jul. 30, 2021, now Pat. No. 11,665,911, which is a continuation of application No. 16/579,757, filed on Sep. 23, 2019, now Pat. No. 11,088,202.

(51) Int. Cl.
*H10B 61/00*     (2023.01)
*H10N 50/01*     (2023.01)
*H10N 50/80*     (2023.01)

(52) U.S. Cl.
CPC ............. *H10B 61/22* (2023.02); *H10N 50/01* (2023.02); *H10N 50/80* (2023.02)

(58) Field of Classification Search
None
See application file for complete search history.

(56) References Cited

U.S. PATENT DOCUMENTS

| 9,209,392 | B1 | 12/2015 | Sung et al. |
| 9,502,466 | B1 | 11/2016 | Chuang et al. |
| 9,583,535 | B2 | 2/2017 | Ito |
| 10,008,662 | B2 | 6/2018 | You et al. |

(Continued)

OTHER PUBLICATIONS

Non-Final Office Action dated Jan. 26, 2021 for U.S. Appl. No. 16/579,757.

(Continued)

*Primary Examiner* — Khaja Ahmad
(74) *Attorney, Agent, or Firm* — Eschweiler & Potashnik, LLC

(57) ABSTRACT

The present disclosure relates to a semiconductor device. The semiconductor device includes a first dielectric layer having a first region and a second region. A bottom electrode is at least partially arranged within the first region of the first dielectric layer. A memory element is over the bottom electrode and a top electrode is over the memory element. A second dielectric layer is over at least the first region of the first dielectric layer. The second dielectric layer surrounds the memory element and at least a part of the top electrode. A third dielectric layer is over the second region of the first dielectric layer and laterally adjacent to the second dielectric layer. A conductive interconnect is in the third dielectric layer and the second region of the first dielectric layer. The first dielectric layer has a different non-zero thickness within the first region than within the second region.

20 Claims, 11 Drawing Sheets

(56) References Cited

U.S. PATENT DOCUMENTS

| | | | |
|---|---|---|---|
| 10,276,485 B2 | 4/2019 | Chen et al. | |
| 10,644,231 B2 | 5/2020 | Peng et al. | |
| 10,833,250 B2 | 11/2020 | Bak et al. | |
| 2004/0217392 A1 | 11/2004 | Mathew et al. | |
| 2013/0119494 A1 | 5/2013 | Li et al. | |
| 2016/0268499 A1 | 9/2016 | You et al. | |
| 2016/0268505 A1 | 9/2016 | Sung et al. | |
| 2016/0322421 A1* | 11/2016 | Ito | H10N 50/10 |
| 2016/0351806 A1* | 12/2016 | Hsieh | H10N 70/068 |
| 2016/0365512 A1 | 12/2016 | Sung et al. | |
| 2016/0380183 A1* | 12/2016 | Chuang | H10N 50/01 |
| | | | 257/421 |
| 2017/0053967 A1* | 2/2017 | Chuang | H10N 50/01 |
| 2017/0194557 A1* | 7/2017 | Chuang | H10N 50/10 |
| 2017/0222128 A1* | 8/2017 | Sung | H01L 29/40 |
| 2017/0309682 A1* | 10/2017 | Chou | H01L 23/5226 |
| 2019/0131524 A1 | 5/2019 | Peng et al. | |
| 2019/0165258 A1 | 5/2019 | Peng et al. | |

OTHER PUBLICATIONS

Notice of Allowance dated Apr. 7, 2021 for U.S. Appl. No. 16/579,757.

* cited by examiner

METHOD OF FORMING MEMORY CELL

REFERENCE TO RELATED APPLICATIONS

This Application is a Continuation of U.S. application Ser. No. 17/389,774, filed on Jul. 30, 2021, which is a Continuation of U.S. application Ser. No. 16/579,757, filed on Sep. 23, 2019 (now U.S. Pat. No. 11,088,202, issued on Aug. 10, 2021). The contents of the above-referenced Patent Applications are hereby incorporated by reference in their entirety.

BACKGROUND

Many modern day electronic devices contain electronic memory configured to store data. Electronic memory may be volatile memory or non-volatile memory. Volatile memory stores data when it is powered, while non-volatile memory is able to store data when power is removed. Magneto-resistive random-access memory (MRAM) is one promising candidate for a next generation non-volatile memory technology. MRAM devices use magnetic tunnel junctions (MTJs) to store data in a manner that allows for high speed data access and low power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
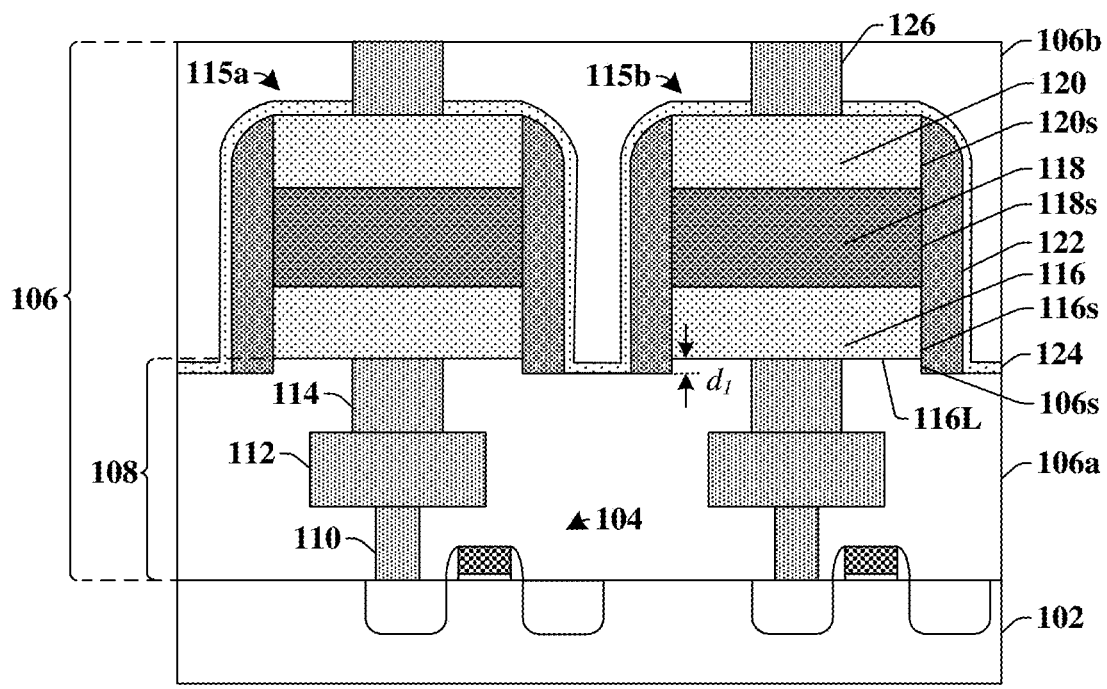
FIG. 1 illustrates a cross-sectional view of some embodiments of an integrated chip having a disclosed memory device formed by a process that patterns a bottom electrode prior to forming sidewall spacers.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Magnetic tunnel junction (MTJ) devices comprise an MTJ vertically arranged between lower and upper conductive electrodes. The MTJ comprises a pinned layer separated from a free layer by a tunnel barrier layer. The magnetic orientation of the pinned layer is static (i.e., fixed), while the magnetic orientation of the free layer is capable of switching between a parallel configuration and an anti-parallel configuration with respect to that of the pinned layer. The parallel configuration provides for a low resistive state that digitally stores data as a first data state (e.g., a logical "1"). The anti-parallel configuration provides for a high resistive state that digitally stores data as a second data state (e.g., a logical "0").

Typically, MTJ devices are formed by depositing an MTJ stack over a bottom electrode layer and subsequently depositing a top electrode layer over the MTJ stack. The top electrode layer and the MTJ stack are then patterned according to a first patterning process to define top electrodes and a plurality of MTJs overlying the bottom electrode layer. A plurality of sidewall spacers and an etch stop layer are formed along sidewalls of the plurality of MTJs. The one or more bottom electrode layers are subsequently patterned according to the sidewall spacers to define bottom electrodes below the plurality of MTJs. Top electrode vias are then formed over the top electrodes. The etch stop layer prevents the top electrode vias from damaging the plurality of MTJs.

It has been appreciated that as a size of MTJ devices has shrunk, the size between adjacent MTJ devices has also shrunk. As the size between adjacent MTJ devices shrinks, a distance between the sidewall spacers of adjacent MTJ devices has become smaller (e.g., between approximately 1 nm and 50 nm), making it increasingly difficult for the second etching process to pattern the bottom electrode layer. Thinning the sidewall spacers can improve the ability of the second etching process to pattern the bottom electrode layer. However, thinning the sidewall spacers may cause the etch stop layer to be exposed and etched during the second etching process. Etching the etch stop layer can lead to MTJ damage during formation of a top electrode via and/or a redeposition of the etch stop material (e.g., aluminum-oxide) that can cause electrical leakage between the bottom electrodes of adjacent MTJ devices.

The present disclosure, in some embodiments, relates to a method of forming an MTJ device that eliminates the second patterning process used to define bottom electrodes. Instead, the present disclosure uses a single etching process to define a top electrode, an MTJ, and a bottom electrode. A sidewall spacer is subsequently formed along sidewalls of the top electrode, the MTJ, and the bottom electrode followed by the formation of an etch stop layer over the sidewall spacer. By using a single patterning process to define the top electrodes, the MTJs, and the bottom electrodes, a size of a gap defining an etching area of a bottom electrode layer is increased. Furthermore, forming the etch stop layer after defining the bottom electrode prevents redeposition of the etch stop layer, thereby mitigating leakage between adjacent MTJ devices.

FIG. 1 illustrates a cross-sectional view of some embodiments of an integrated chip 100 having a disclosed memory device formed by a process that patterns a bottom electrode prior to forming sidewall spacers.

The integrated chip 100 comprises an access device 104 arranged over a substrate 102. A dielectric structure 106 is also arranged over the substrate 102 and surrounds the access device 104. The dielectric structure 106 comprises a lower dielectric structure 106a surrounding a plurality of lower interconnect layers 108, which are electrically coupled to the access device 104. In some embodiments, the access device 104 may comprise a transistor device (e.g., a MOSFET, a bi-polar junction transistor (BJT), a high electron mobility transistor (HEMT), or the like). In some embodiments, the plurality of lower interconnect layers 108 comprise layers of conductive contacts 110, interconnect wires 112, and interconnect vias 114.

A plurality of memory devices 115a-115b are disposed within the dielectric structure 106 over the plurality of lower interconnect layers 108. The plurality of memory devices 115a-115b comprise a data storage structure 118 disposed between a bottom electrode 116 and a top electrode 120. The data storage structure 118 is configured to storage a data state (e.g., corresponding to a logical "0" or a logical "1"). In various embodiments, the data storage structure 118 may comprise a magnetic tunnel junction, a high-k dielectric material, or the like.

One or more sidewall spacers 122 are arranged along sidewalls of the plurality of memory devices 115a-115b. The sidewall spacers 122 continuously extend along outermost sidewalls 120s of the top electrode 120, outermost sidewalls 118s of the data storage structure 118, and outermost sidewalls 116s of the bottom electrode 116 to below the outermost sidewalls 116s of the bottom electrode 116. For example, in some embodiments, the sidewall spacers 122 may extend a distance $d_1$ below a bottom of the outermost sidewalls 116s of the bottom electrode 116. In some embodiments, the sidewall spacers 122 may extend along a sidewall 106s of the lower dielectric structure 106a underlying a lower surface 116L of the bottom electrode 116. The sidewall spacers 122 have interior sidewalls that completely cover the outermost sidewalls 116s of the bottom electrode 116. In some embodiments, the interior sidewalls of the sidewall spacers 122 may directly contact the outermost sidewalls 120s of the top electrode 120, the outermost sidewalls 118s of the data storage structure 118, and the outermost sidewalls 116s of the bottom electrode 116. In some additional embodiments, the interior sidewalls of the sidewall spacers 122 may further contact the sidewall 106s of the lower dielectric structure 106a.

A top electrode via (TEVA) etch stop layer 124 is arranged along outer sidewalls of the sidewall spacer 122 and an upper dielectric structure 106b is arranged on the TEVA etch stop layer 124. In some embodiments, the TEVA etch stop layer 124 may continuously extend from a sidewall of a first memory device 115a of the plurality of memory devices 115a-115b to a sidewall of a second memory device 115b of the plurality of memory devices 115a-115b. In such embodiments, the TEVA etch stop layer 124 has a vertically extending segment and a horizontally extending segment. The vertically extending segment is arranged along a sidewall of the sidewall spacers 122 and protrudes outward from a top surface of the horizontally extending segment to a horizontal line that is parallel to and disposed along a top surface of the top electrode 120.

The sidewall spacers 122 completely cover the outermost sidewalls 116s of the bottom electrode 116 because the sidewall spacers 122 are formed after performing one or more patterning processes that define the bottom electrode 116. By forming the sidewall spacers 122 after the one or more patterning processes, the bottom electrode 116 is able to be more easily patterned at a small pitch (i.e., with a small space between adjacent memory devices 115a-115b). Furthermore, because the TEVA etch stop layer 124 is disposed over the sidewall spacers 122 it is also not subjected to an etching process, thereby preventing redeposition of material from the TEVA etch stop layer 124 that could lead to electrical leakage between adjacent ones of the plurality of memory devices 115a-115b.

Figure 2:
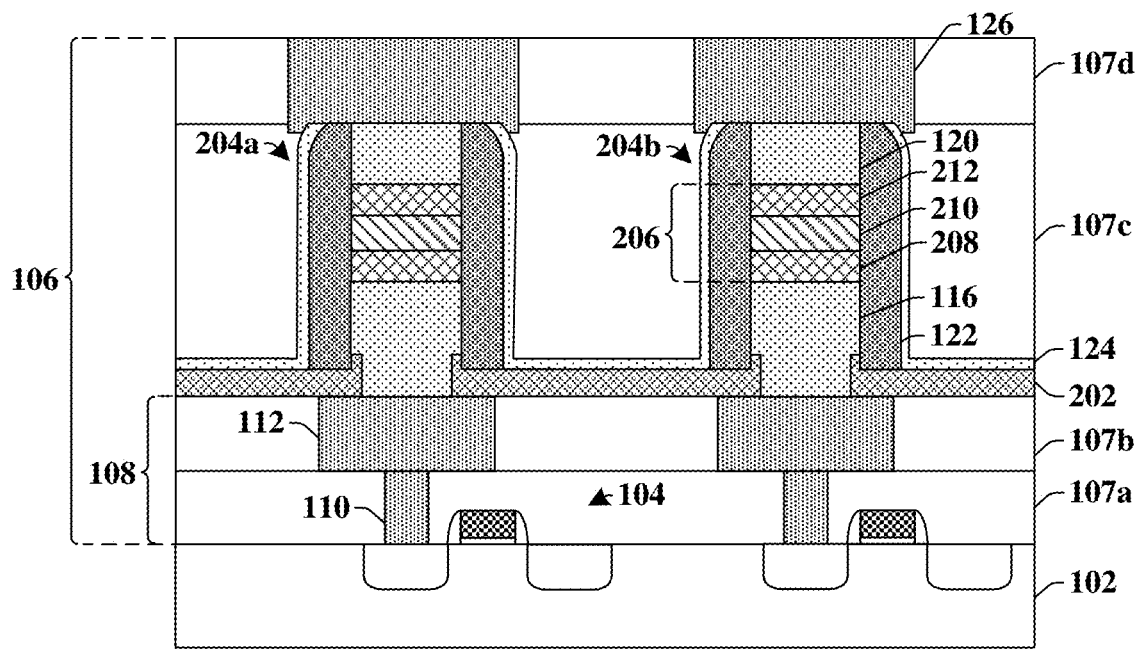
FIG. 2 illustrates a cross-sectional view of some embodiments of an integrated chip having a disclosed memory device.

FIG. 2 illustrates a cross-sectional view of additional some embodiments of an integrated chip 200 having a disclosed memory device.

The integrated chip 200 comprises a dielectric structure 106 disposed over a substrate 102. The dielectric structure 106 comprises a plurality of stacked inter-level dielectric (ILD) layers 107a-107d. In some embodiments, the plurality of stacked ILD layers 107a-107d may comprise one or more of silicon dioxide, doped silicon dioxide (e.g., carbon doped silicon dioxide), silicon oxynitride, borosilicate glass (BSG), phosphoric silicate glass (PSG), borophosphosilicate glass (BPSG), fluorinated silicate glass (FSG), or the like.

A plurality of lower interconnect layers 108 are arranged within a plurality of lower ILD layers 107a-107b of the dielectric structure 106. In some embodiments, the plurality of lower interconnect layers 108 comprise conductive contacts 110 and interconnect wires 112 respectively surrounded by one of the plurality of lower ILD layer 107a-107b. In some additional embodiments (not shown), the plurality of lower interconnect layers 108 may further comprise conductive vias. In some embodiments, the interconnect wires 112 and/or conductive vias may comprise a diffusion barrier layer (e.g., tantalum, titanium nitride, or the like) surrounding a metal core (e.g., copper, tungsten, aluminum, or the like).

A lower insulating structure 202, comprising one or more dielectric materials, is arranged over the plurality of lower ILD layers 107a-107b. In various embodiments, the lower insulating structure 202 may comprise an oxide (e.g., silicon oxide, silicon rich oxide, etc.), a nitride (e.g., silicon nitride, silicon oxynitride, etc.), a carbide (e.g., silicon carbide, silicon oxycarbide, etc.), Tetraethyl orthosilicate (TEOS), and/or the like. For example, in some embodiments, the lower insulating structure 202 may comprise a layer of silicon oxide, while in other embodiments the lower insulating structure 202 may comprise a layer of silicon rich oxide disposed between layers of silicon carbide.

A plurality of MTJ devices 204a-204b are arranged within the dielectric structure 106 over the lower insulating structure 202. The plurality of MTJ devices 204a-204b include a bottom electrode 116 that is separated from a top electrode 120 by a magnetic tunnel junction (MTJ) 206. The bottom electrode 116 extends from over the lower insulating structure 202 to the plurality of lower interconnect structures 108 under the lower insulating structure 202. In some embodiments, the bottom electrode 116 may comprise a liner (e.g., a glue layer and/or a diffusion barrier layer) and an overlying conductive material. In some embodiments, the liner may comprise tantalum nitride, titanium nitride, or the like. In some embodiments, the conductive material may comprise titanium, tantalum, or the like. In some embodiments, the top electrode 120 may comprise one or more of titanium, tantalum, tungsten, tantalum nitride, titanium nitride, or the like.

In some embodiments, the MTJ 206 may comprise a pinned layer 208 separated from a free layer 212 by a dielectric tunnel barrier 210. The pinned layer 208 has a magnetization that is fixed, while the free layer 212 has a magnetization that can be changed during operation (through the tunnel magnetoresistance (TMR) effect) to be either parallel (i.e., a 'P' state) or anti-parallel (i.e., an 'AP' state) with respect to the magnetization of the pinned layer 208. A relationship between the magnetizations of the pinned layer 208 and the free layer 212 define a resistive state of the MTJ 206 and thereby enables the MTJ 206 to store a data state.

In some embodiments, the pinned layer 208 may comprise cobalt, iron, boron, nickel, ruthenium, iridium, platinum, or the like. In some embodiments, the dielectric tunnel barrier 210 may comprise magnesium oxide, aluminum oxide, nickel oxide, gadolinium oxide, tantalum oxide, molybdenum oxide, titanium oxide, tungsten oxide, or the like. In some embodiments, the free layer 212 may comprise cobalt, iron, boron, iron cobalt, nickel cobalt, cobalt iron boride, iron boride, iron platinum, iron palladium, or the like.

One or more sidewall spacers 122 and a top electrode via (TEVA) etch stop layer 124 extend along sidewalls of the plurality of MTJ devices 204a-204b. In various embodiments, the sidewalls spacers 122 may comprise silicon nitride, a silicon dioxide (SiO$_2$), a nitride (e.g., silicon oxy-nitride, silicon nitride, etc.), a carbide (e.g., silicon carbide, etc.), or the like. In various embodiments, the TEVA etch stop layer 124 may comprise one or more of silicon nitride (e.g., Si$_3$N$_4$), a metal-oxide (e.g., aluminum-oxide, hafnium-oxide, etc.), or the like. An intermediate ILD layer 107c is arranged over the TEVA etch stop layer 124. In some embodiments, a top surface of the intermediate ILD layer 107c is substantially co-planar (e.g., co-planar within a tolerance of a chemical mechanical planarization (CMP) process) with top surfaces of the TEVA etch stop layer 124 and/or the top electrode 120.

An upper interconnect structure 126 is disposed within an upper ILD structure 107d over the intermediate ILD layer 107c. The upper interconnect structure 126 contacts the top electrode 120. In some embodiments, the upper interconnect structure 126 may vertically extend below a top surface of the intermediate ILD layer 107c. In some such embodiments, the TEVA etch stop layer 124 may laterally separate the upper interconnect structure 126 from sidewalls of the top electrode 120.

Figure 3:
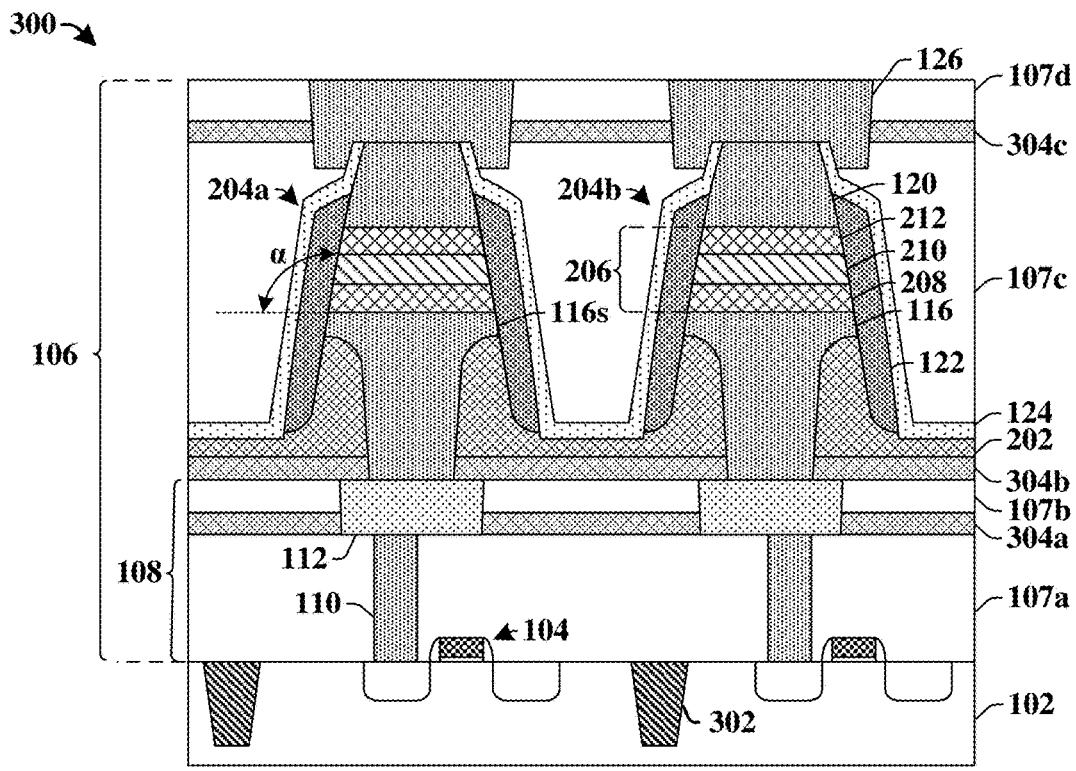
FIG. 3 illustrates a cross-sectional view of some embodiments of an integrated chip having a disclosed memory device.

FIG. 3 illustrates a cross-sectional view of additional some embodiments of an integrated chip 300 having a disclosed memory device.

The integrated chip 300 comprises one or more access devices 104 disposed within a substrate 102. In some embodiments, the one or more access devices 104 are laterally separated by way of an isolation structure 302 disposed within the substrate 102. In some embodiments, the isolation structure 302 may comprise a shallow trench isolation (STI) structure comprising one or more dielectric materials disposed within a trench defined by sidewalls of the substrate 102.

A dielectric structure 106 is disposed over the substrate 102. The dielectric structure 106 comprises a plurality of lower ILD layers 107a-107b surrounding a plurality of lower interconnect layers 108. In some embodiments, the plurality of lower ILD layers 107a-107b may comprise a first ILD layer 107a separated from a second ILD layer 107b by way of a first etch stop layer 304a. A second etch stop layer 304b is disposed over the plurality of lower ILD layers 107a-107b. In some embodiments, the first etch stop layer 304a and/or the second etch stop layer 304b may comprise a carbide, a nitride, or the like. A lower insulating structure 202 is arranged over the second etch stop layer 304b. The lower insulating structure 202 comprises first sidewalls directly overlying one of the plurality of lower interconnect layers 108. The first sidewalls extend between a bottommost surface of the lower insulating structure 202 and a topmost surface of the lower insulating structure 202. The lower insulating structure 202 further comprises second sidewalls that extend between the topmost surface of the lower insulating structure 202 and an upper surface of the lower insulating structure 202.

A bottom electrode 116 is arranged within the opening and over the topmost surface of the lower insulating structure 202. The bottom electrode 116 comprises a top surface having a first width and a bottom surface having a second width that is smaller than the first width. The top surface extends between outermost sidewalls 116s of the bottom electrode 116. The bottom electrode 116 extends through the lower insulating structure 202 and the second etch stop layer 304b to one of the plurality of lower interconnect layers 108. In some embodiments, the lower insulating structure 202 may have a greater thickness directly below the bottom electrode 116 than laterally outside of the bottom electrode 116.

An MTJ 206 is arranged over the top surface of the bottom electrode 116 and a top electrode 120 is arranged over the MTJ 206. In some embodiments, the MTJ 206 may directly contact the top surface of the bottom electrode 116. In some embodiments, the top surface of the bottom electrode 116 may have a width that is substantially equal to a width of a bottom surface of the MTJ 206. In some embodiments, the bottom electrode 116, the MTJ 206, and the top electrode 120 may have outermost sidewalls that are oriented at a first angle α with respect to a horizontal line extending along the top surface of the bottom electrode 116. In some embodiments, the first angle α may be an acute angle. For example, in some embodiments, the first angle α may be in a range of between 80° and 90°.

One or more sidewall spacers 122 extend along the outermost sidewalls of the top electrode 120, the MTJ 206, and the bottom electrode 116. In some embodiments, the sidewall spacers 122 may further extend along the second sidewalls of the lower insulating structure 202. In some embodiments, the sidewall spacers 122 may have a topmost surface that is recessed below a topmost surface of the top electrode 120. In some embodiments, the sidewall spacers 122 may respectively have a substantially constant width between a bottommost surface of the sidewall spacers 122 and a topmost surface of the sidewall spacers 122. In some embodiments, the sidewall spacers 122 may have a width in a range of between approximately 4 nanometers and approximately 20 nanometers.

A top electrode via (TEVA) etch stop layer 124 is arranged over the sidewall spacer 122 and the lower insulating structure 202. The TEVA etch stop layer 124 vertically extends from over a top of the sidewall spacers 122 to below the topmost surface of the lower insulating structure 202. In some embodiments, a bottommost surface of the TEVA etch stop layer 124 is arranged along a horizontal plane that extends through the first sidewalls of the lower insulating structure 202. In some embodiments, the TEVA etch stop layer 124 directly contacts an upper surface of the lower insulating structure 202 at a position that is between sidewalls of the sidewall spacers 122. In some embodiments, the TEVA etch stop layer 124 may extend to a position that is below a bottom of the sidewall spacers 122. For example, in some embodiments, the TEVA etch stop layer 124 may extend below the bottom surface of the sidewall spacers 122 by a distance that is in a range of between approximately 0 angstroms and approximately 200 angstroms. In some embodiments (not shown), the TEVA etch stop layer 124 may extend through the lower insulating structure 202 to contact the second etch stop layer 304b. In some embodiments, the TEVA etch stop layer 124 may have a thickness in a range of between approximately 10 angstroms and approximately 100 angstroms.

An intermediate ILD layer 107c is over the TEVA etch stop layer 124. In some embodiments, the intermediate ILD layer 107c laterally extends for a distance $d_2$ between the sidewall spacers 122 surrounding a first MTJ device 204a and the sidewall spacers 122 surrounding a second MTJ device 204b. In some embodiments, distance $d_2$ is in a range of between approximately 20 nanometers and approximately 150 nanometers. In some embodiments, the intermediate ILD layer 107c directly contacts sidewalls of the sidewall spacers 122. A third etch stop layer 304c (e.g., comprising an oxide, a nitride, a carbide, or the like) is over the intermediate ILD layer 107c, and an upper ILD structure 107d is over the third etch stop layer 304c. An upper interconnect structure 126 extends through the upper ILD structure 107d and the third etch stop layer 304c to contact the top electrode 120.

Figure 4:
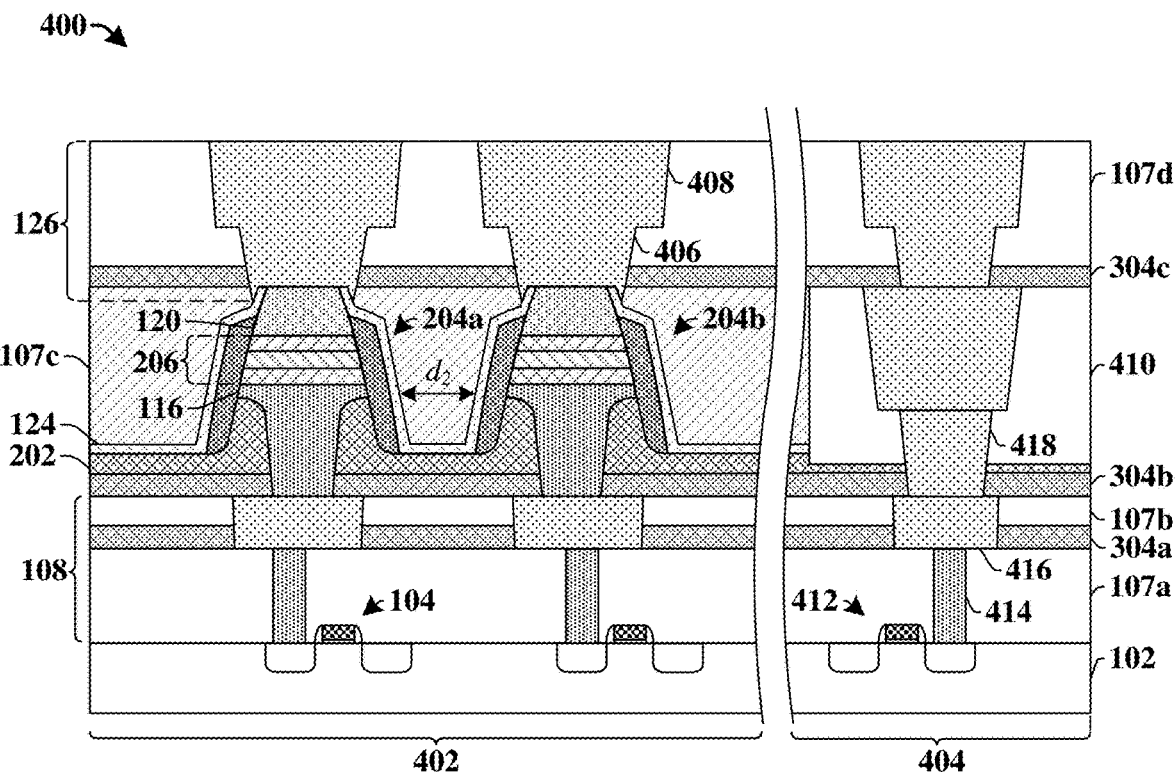
FIG. 4 illustrates a cross-sectional view of some embodiments of an integrated chip having a disclosed memory device.

FIG. 4 illustrates a cross-sectional view of additional some embodiments of an integrated chip 400 having a disclosed memory device.

The integrated chip 400 comprises a substrate 102 including an embedded memory region 402 and a logic region 404. Within the embedded memory region 402, a plurality of lower interconnect layers 108 are disposed within one or more lower ILD layers 107a-107b. The plurality of lower interconnect layers 108 are coupled between access devices 104 arranged within the substrate 102 and MTJ devices 204a-204b arranged over a lower insulating structure 202. The MTJ devices 204a-204b respectively comprise an MTJ 206 disposed between a bottom electrode 116 and a top electrode 120. One or more sidewall spacers 122 are disposed along opposing sides of the top electrode 120, the MTJ 206, the bottom electrode 116, and the lower insulating structure 202. A TEVA etch stop layer 124 is disposed on the sidewall spacers 122.

An intermediate ILD layer 107c is disposed over the lower insulating structure 202 and surrounding the MTJ devices 204a-204b. An upper interconnect structure 126 is disposed within an upper ILD structure 107d over the intermediate ILD layer 107c. The upper interconnect structure 126 may comprise a top electrode via 406 and an upper interconnect wire 408 laterally extending past one or more sides of the top electrode via 406. The top electrode via 406 couples the top electrode 120 to the upper interconnect wire 408. The top electrode via 406 is disposed directly on the top electrode 120. In some embodiments, the top electrode via 406 and the upper interconnect wire 408 may comprise aluminum, copper, tungsten, or the like.

In some embodiments, the top electrode via 406 may vertically extend below a top of the intermediate ILD layer 107c. In some such embodiments, the top electrode via 406 may extend from over the top electrode 120 to along sides of the TEVA etch stop layer 124. In such embodiments, the top electrode via 406 may be laterally separated from sidewalls of the top electrode 120 by way of the TEVA etch stop layer 124.

Within the logic region 404, one or more additional interconnect layers are disposed within the dielectric structure 106. The one or more additional interconnect layers comprise a conductive contact 414, an interconnect wire 416, and an interconnect via 418. The one or more additional interconnect layers are coupled to a logic device 412 arranged within the substrate 102. In some embodiments, the logic device 412 may comprise a transistor device (e.g., a MOSFET, a bi-polar junction transistor (BJT), a high electron mobility transistor (HEMT), or the like).

In some embodiments, the dielectric structure 106 may comprise a logic ILD layer 410 arranged over the one or more lower ILD layers 107a-107b within the logic region 404. The logic ILD layer 410 may comprise a different material than the intermediate ILD layer 107c. In some embodiments, the logic ILD layer 410 may have a lower dielectric constant than the intermediate ILD layer 107c. For example, in some embodiments the logic ILD layer 410 may comprise a low-k dielectric material (i.e., a dielectric material having a dielectric constant that is less than approximately 3.9), while the intermediate ILD layer 107c may comprise an oxide. In some embodiments, the logic ILD layer 410 may comprise a carbon doped silicon dioxide, silicon oxynitride, borosilicate glass (BSG), phosphoric silicate glass (PSG), borophosphosilicate glass (BPSG), fluorinated silicate glass (FSG), a porous dielectric material, or the like.

In some embodiments, the logic ILD layer 410 may have a sidewall that contacts an outermost sidewall of the TEVA etch stop layer 124 and a sidewall of the lower insulating structure 202. In some such embodiments, the lower insulating structure 202 may have a smaller height within the logic region 404 than within the embedded memory region 402.

FIGS. 5-21 illustrate cross-sectional views 500-2100 of some embodiments of a method of forming a plurality of MTJ devices by defining bottom electrodes of the MTJ devices prior to forming sidewall spacers along sides of the MTJ devices. Although FIGS. 5-21 are described in relation to a method, it will be appreciated that the structures disclosed in FIGS. 5-21 are not limited to such a method, but instead may stand alone as structures independent of the method.

Figure 5:
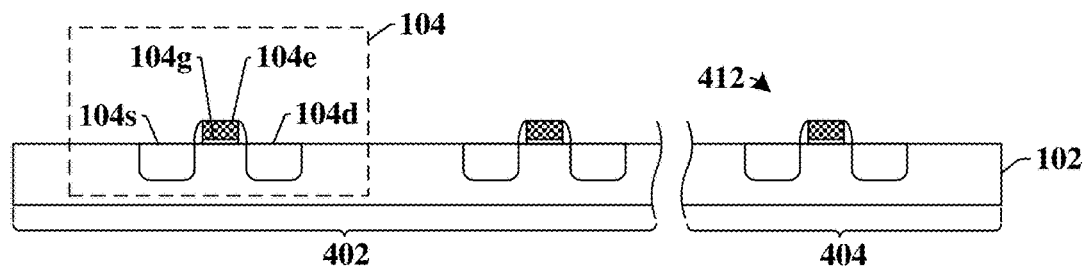
FIGS. 5-21 illustrate cross-sectional views of some embodiments of a method of forming a plurality of MTJ devices, which defines bottom electrodes of the MTJ devices prior to forming sidewall spacers along sides of the MTJ devices.

As shown in cross-sectional view 500 of FIG. 5, a substrate 102 is provided. The substrate 102 comprises an embedded memory region 402 and a logic region 404. An access device 104 is formed within the embedded memory region 402 of the substrate 102 and a logic device 412 is formed within the logic region 404 of the substrate 102. In various embodiments, the substrate 102 may be any type of semiconductor body (e.g., silicon, SiGe, SOI, etc.), such as a semiconductor wafer and/or one or more die on a wafer, as well as any other type of semiconductor and/or epitaxial layers, associated therewith. In some embodiments, the access device 104 and/or the logic device 412 may comprise a transistor. In some such embodiments, the access device 104 may be formed by depositing a gate dielectric film and a gate electrode film over the substrate 102. The gate dielectric film and the gate electrode film are subsequently patterned to form a gate dielectric 104g and a gate electrode 104e. The substrate 102 may be subsequently implanted to form a source region 104s and a drain region 104d within the substrate 102 on opposing sides of the gate electrode 104e.

Figure 6:
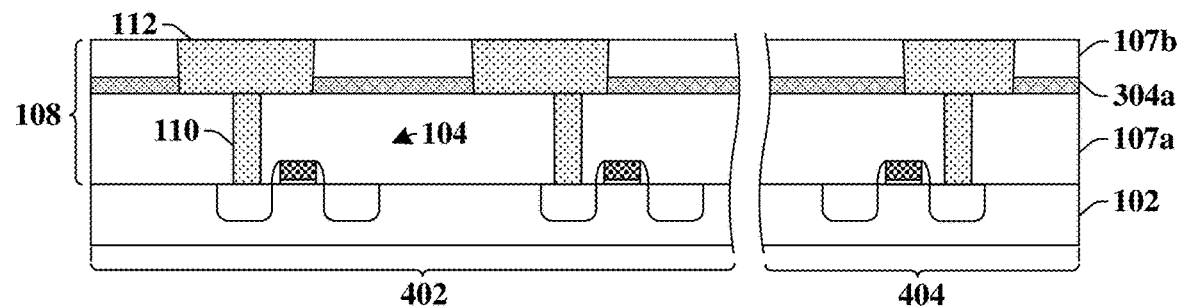

As shown in cross-sectional view 600 of FIG. 6, a plurality of lower interconnect layers 108 are formed within one or more lower inter-level dielectric (ILD) layers 107a-107b over the substrate 102. In some embodiments, the one or more lower ILD layers 107a-107b may comprise a first ILD layer 107a and a second ILD layer 107b separated by a first etch stop layer 304a. In some embodiments, the plurality of lower interconnect layers 108 may comprise a conductive contact 110 and an interconnect wire 112. In some additional embodiments (not shown), the plurality of lower interconnect layers 108 may further comprise an interconnect via. The plurality of lower interconnect layers 108 may be formed by forming one of the one or more lower ILD layers 107a-107b over the substrate 102 (e.g., an oxide, a low-k dielectric, or an ultra low-k dielectric), selectively etching the one or more lower ILD layers 107a-107b to define a via hole and/or a trench within the ILD layer, forming a conductive material (e.g., copper, aluminum, etc.) within the via hole and/or a trench, and performing a planarization process (e.g., a chemical mechanical planarization process).

Figure 7:
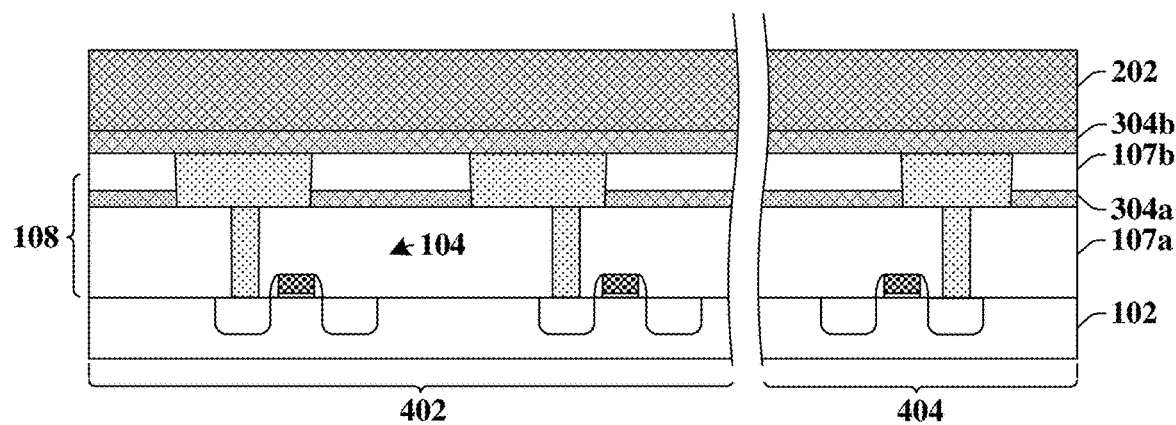

As shown in cross-sectional view 700 of FIG. 7, a second etch stop layer 304b is formed over the one or more lower ILD layers 107a-107b and a lower insulating structure 202 is formed onto the second etch stop layer 304b. In some embodiments, the second etch stop layer 304b may comprise one or more of silicon-nitride, silicon-carbide, or the like. In some embodiments, the lower insulating structure 202 may comprise one or more of an oxide, silicon-nitride, silicon-carbide, TEOS, or the like. In some embodiments, the lower insulating structure 202 may be formed by a plurality of different deposition processes (e.g., physical vapor deposition (PVD), chemical vapor deposition (CVD), PE-CVD, atomic layer deposition (ALD), sputtering, etc.) to a thickness in a range of between approximately 200 angstroms and approximately 300 angstroms.

Figure 8:
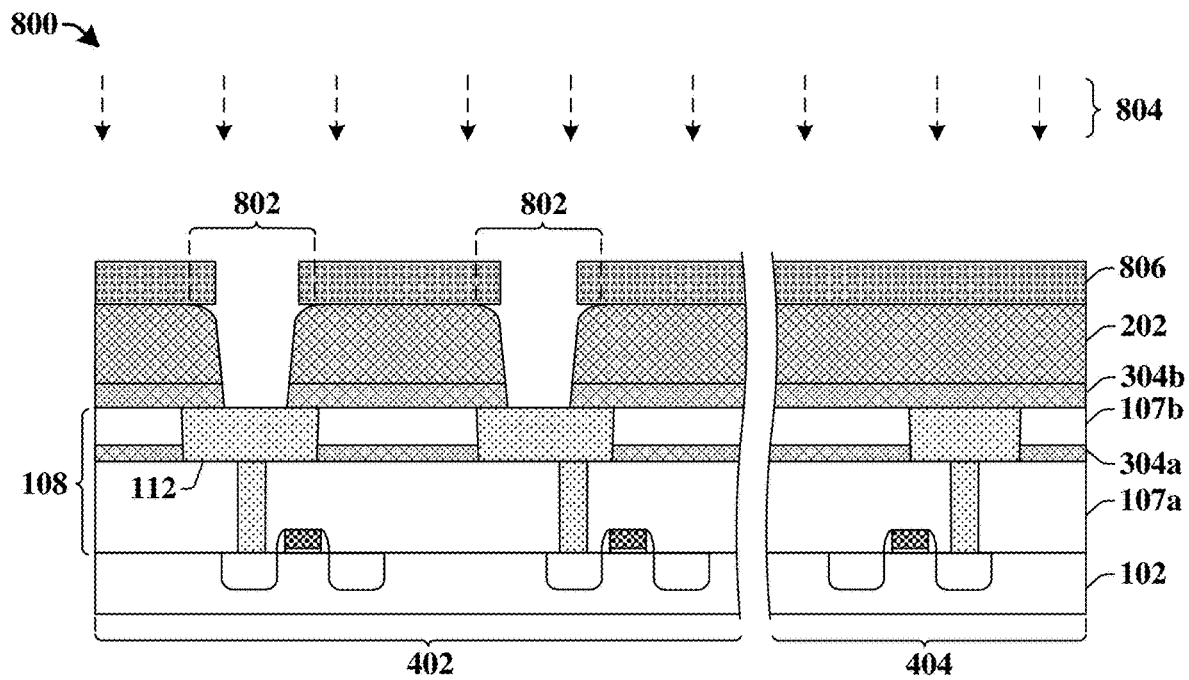

As shown in cross-sectional view 800 of FIG. 8, the second etch stop layer 304b and the lower insulating structure 202 are selectively patterned to define a plurality of openings 802 extending through the second etch stop layer 304b and the lower insulating structure 202. The plurality of openings 802 expose one of the plurality of lower interconnect layers 108 (e.g., interconnect wire 112) underlying the lower insulating structure 202. In some embodiments, the second etch stop layer 304b and the lower insulating structure 202 may be selectively patterned by exposing the second etch stop layer 304b and the lower insulating structure 202 to an etchant 804 according to a patterned masking layer 806 disposed on the lower insulating structure 202.

Figure 9:
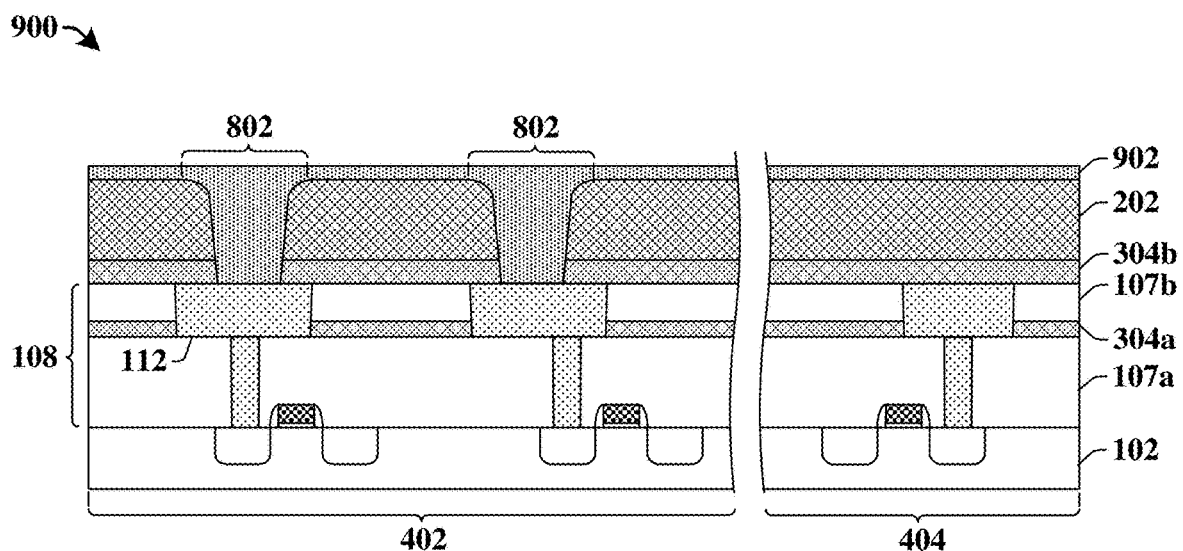

As shown in cross-sectional view 900 of FIG. 9, one or more bottom electrode layers 902 may be formed over the lower insulating structure 202 and within the openings 802. The one or more bottom electrode layers 902 extend through the lower insulating structure to one of the plurality of lower interconnect layers 108 (e.g., to interconnect wire 112). In some embodiments, the one or more bottom electrode layers 902 may be formed by depositing a liner followed by depositing a conductive material. In various embodiments, the liner may comprise a glue layer configured to increase adhesion between adjacent layers and/or a diffusion barrier layer configured to prevent diffusion between adjacent layers. In some embodiments, the liner may comprise tantalum nitride, titanium nitride, or the like. In some embodiments, the conductive material may comprise tantalum, titanium, or the like. In some embodiments, a planarization process (e.g., a chemical mechanical planarization process) may be performed after depositing the conductive material, followed by the deposition of an additional conductive material onto the lower insulating layer and the conductive material. In other embodiments, no planarization process is performed after depositing the conductive material.

Figure 10:
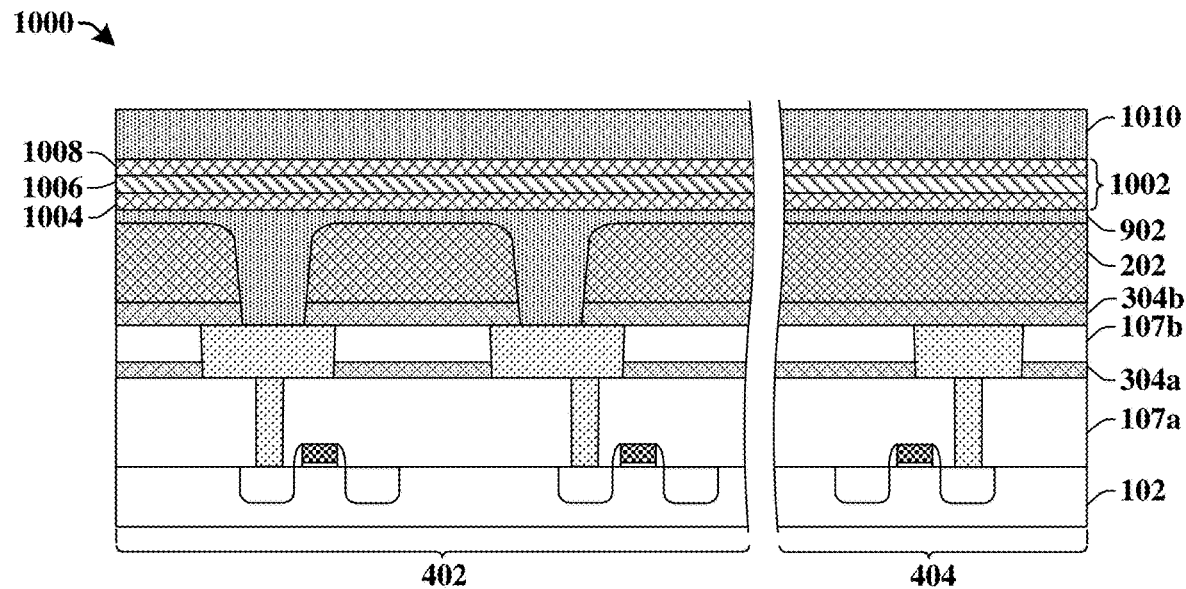

As shown in cross-sectional view 1000 of FIG. 10, a MTJ stack 1002 is formed over the one or more bottom electrode layers 902. In some embodiments, the MTJ stack 1002 may comprise a lower ferromagnetic layer 1004 formed over the one or more bottom electrode layers 902, a tunneling barrier layer 1006 formed over the lower ferromagnetic layer 1004, and an upper ferromagnetic electrode 1008 formed over the tunneling barrier layer 1006. One or more top electrode layers 1010 (e.g., titanium, tantalum, titanium nitride, or the like) are subsequently formed over the MTJ stack 1002.

Figure 11:
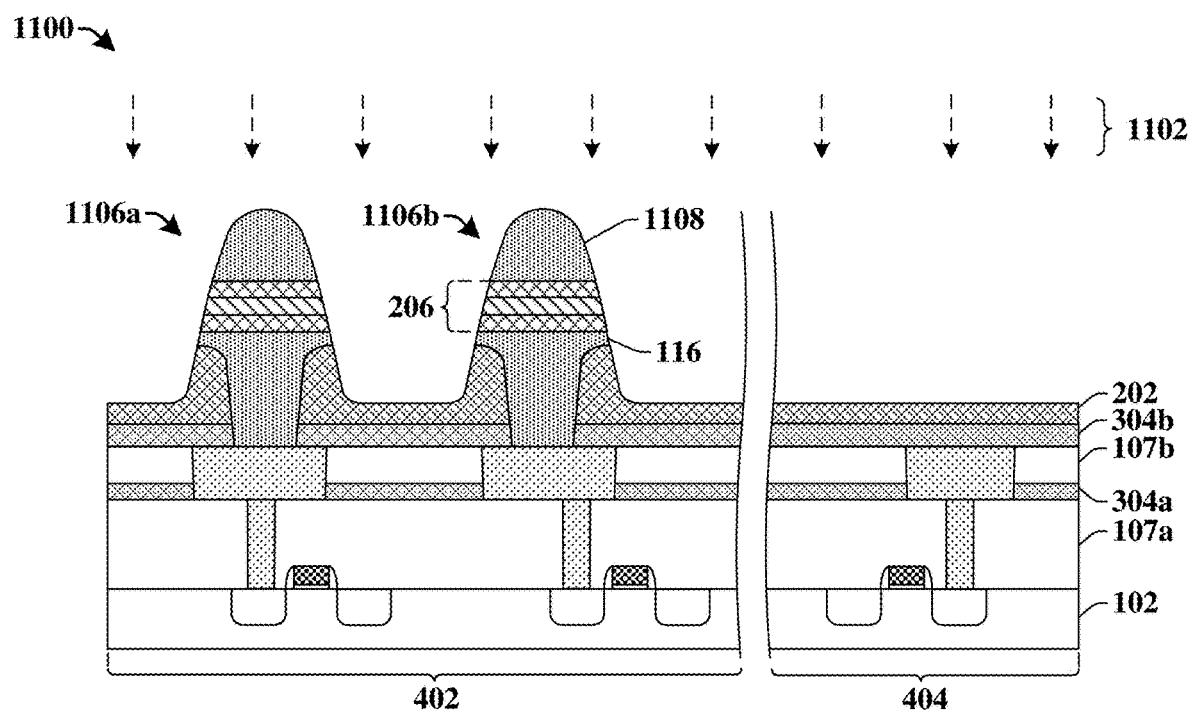

As shown in cross-sectional view 1100 of FIG. 11, one or more patterning processes are performed to define a plurality of MTJ device stacks 1106a-1106b. The one or more patterning processes selectively expose the one or more top electrode layers (1010 of FIG. 10), the MTJ stack (1002 of FIG. 10), and the one or more bottom electrode layers (902 of FIG. 10) to an etchant 1102 to define an MTJ 206 disposed between a bottom electrode 116 and a top electrode structure 1108. The one or more patterning processes may further etch the lower insulating structure 202 to define sidewalls of the lower insulating structure under the bottom electrode 116. Etching the lower insulating structure 202 causes the lower insulating structure 202 to have a smaller thickness laterally outside of the bottom electrode 116 than directly below the bottom electrode 116. In some embodiments, the thickness of the lower insulating structure 202 directly below the bottom electrode 116 may be between approximately 2 and approximately 5 times larger than a thickness of the lower insulating structure 202 outside of the bottom electrode 116. In other embodiments, the thickness of the lower insulating structure 202 directly below the bottom electrode 116 may be more than 5 times larger than a thickness of the lower insulating structure 202 outside of the bottom electrode 116.

In some embodiments, the one or more patterning processes may comprise a single etching process (e.g., a continuous etching process using a same etchant). In other embodiments, the one or more patterning processes may comprise a plurality of etching processes (e.g., a plurality of discrete etching processes separated in time) performed in-situ within a processing chamber. In some embodiments, the one or more patterning processes may be performed with a masking layer (e.g., photoresist layer, hardmask layer, or the like) in place over the top electrode layer (1010 of FIG. 10).

Figure 12:
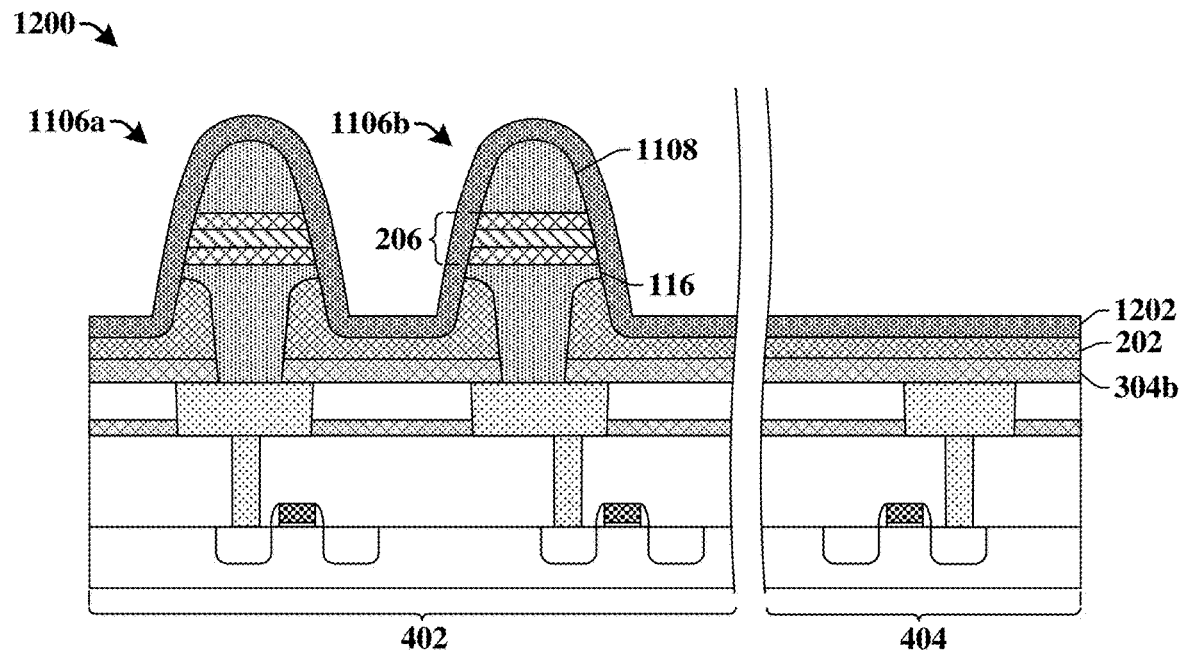

As shown in cross-sectional view 1200 of FIG. 12, a spacer layer 1202 is formed over the lower insulating structure 202 and the plurality of MTJ device stacks 1106a-1106b after completion of the one or more patterning processes. The spacer layer 1202 is formed to contact sidewalls of the lower insulating structure 202, the bottom electrode 116, the MTJ 206, and the top electrode structure 1108. In some embodiments, the spacer layer 1202 may be formed to a substantially constant thickness in a range of between approximately 40 Angstroms and approximately 400 Angstroms. In some embodiments, the spacer layer 1202 may be formed using a deposition technique (e.g., PVD, CVD, PE-CVD, ALD, sputtering, etc.). In various embodiments, the spacer layer 1202 may comprise silicon nitride, a silicon dioxide ($SiO_2$), silicon oxy-nitride (e.g., SiON), or the like.

Figure 13:
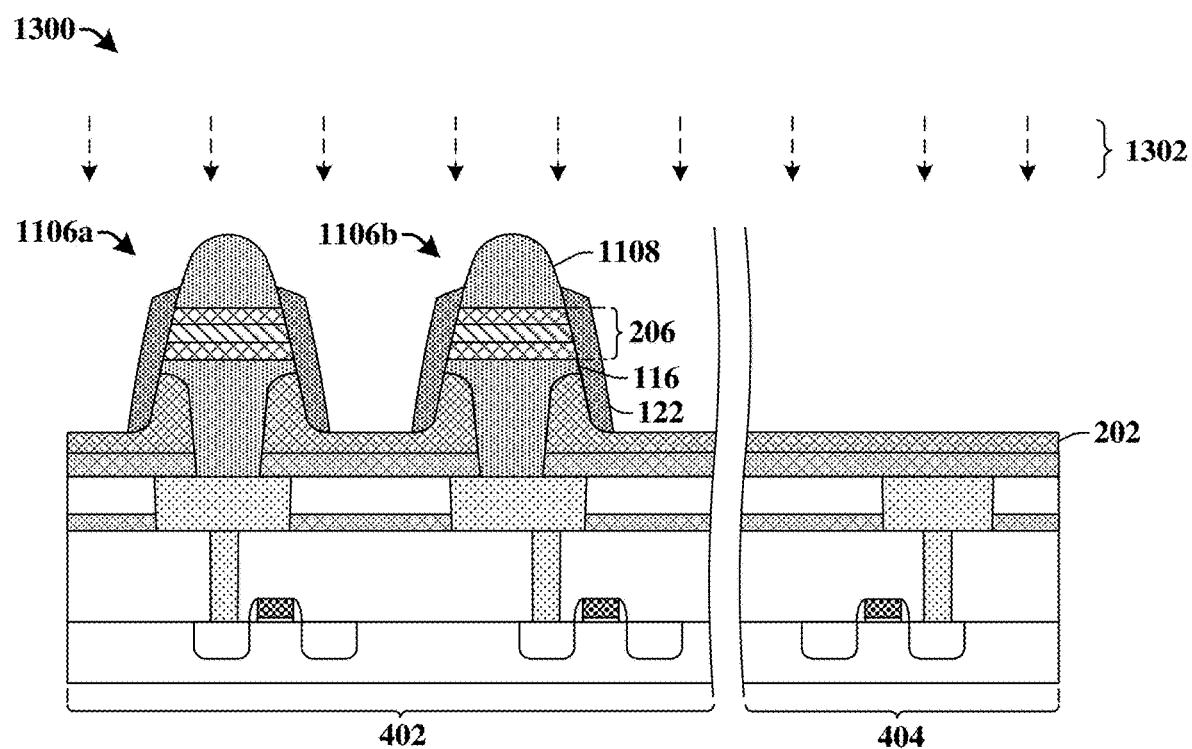

As shown in cross-sectional view 1300 of FIG. 13, the spacer layer (1202 of FIG. 12) is exposed to an etchant 1302, which removes the spacer layer from horizontal surfaces. Removing the spacer layer from horizontal surfaces leaves a part of the spacer layer along opposing sides of the plurality of MTJ device stacks 1106a-1106b as the sidewall spacers 122. In some embodiments, etching the spacer layer may cause the sidewalls spacers 122 to be recessed below a top of the top electrode structure 1108. In some embodiments, the etchant 1302 may comprise a dry etchant.

Figure 14:
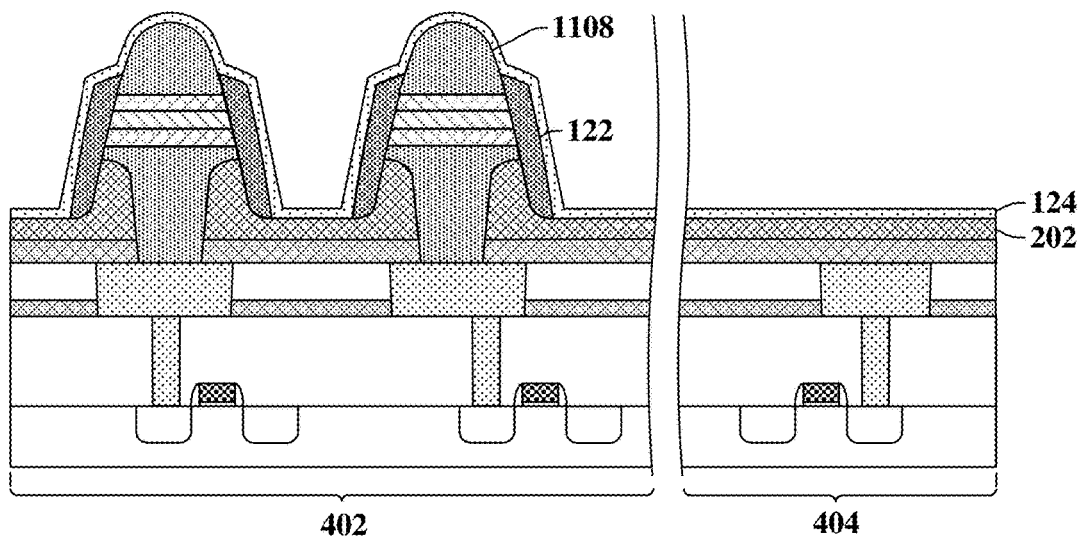

As shown in cross-sectional view 1400 of FIG. 14, a top electrode via (TEVA) etch stop layer 124 is formed over the sidewall spacers 122, the top electrode structure 1108, and the lower insulating structure 202. In some embodiments, the TEVA etch stop layer 124 may comprise a metal-oxide (e.g., aluminum-oxide, hafnium-oxide, etc.), silicon nitride, or the like. In some embodiments, the TEVA etch stop layer 124 may be formed by way of a deposition process (e.g., PVD, CVD, PE-CVD, ALD, or the like) to a thickness in a range of between approximately 1 nanometer and approximately 10 nanometers.

Figure 15:
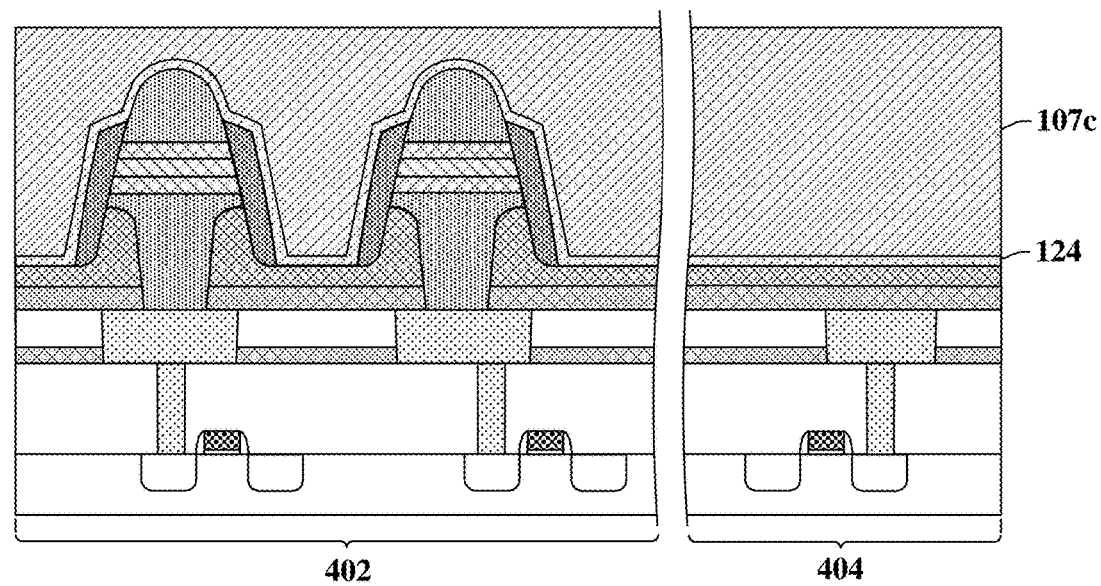

As shown in cross-sectional view 1500 of FIG. 15, an intermediate ILD layer 107c is formed over the TEVA etch stop layer 124. The intermediate ILD layer 107c is formed to completely cover a top of the TEVA etch stop layer 124. In some embodiments, the intermediate ILD layer 107c may be formed by a deposition process (e.g., PVD, CVD, PE-CVD, ALD, or the like). In various embodiments, the intermediate ILD layer 107c may comprise an oxide (e.g., silicon dioxide) or the like.

Figure 16:
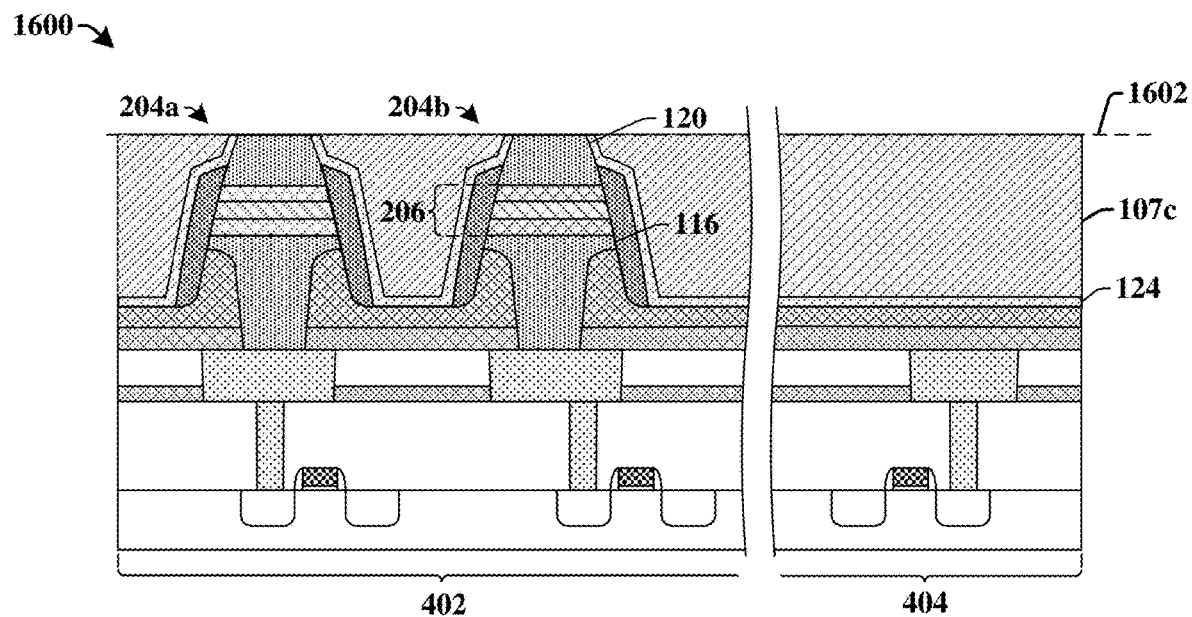

As shown in cross-sectional view 1600 of FIG. 16, a planarization process is performed (along line 1602) to remove parts of the intermediate ILD layer 107c, the TEVA etch stop layer 124, and the top electrode structure (1108 of FIG. 15). By removing a part of the top electrode structure, the planarization process defines a plurality of MTJ devices 204a-204b respectively having a top electrode 120 over the MTJ 206. In some embodiments, the planarization process may comprise a chemical mechanical planarization (CMP) process.

Figure 17:
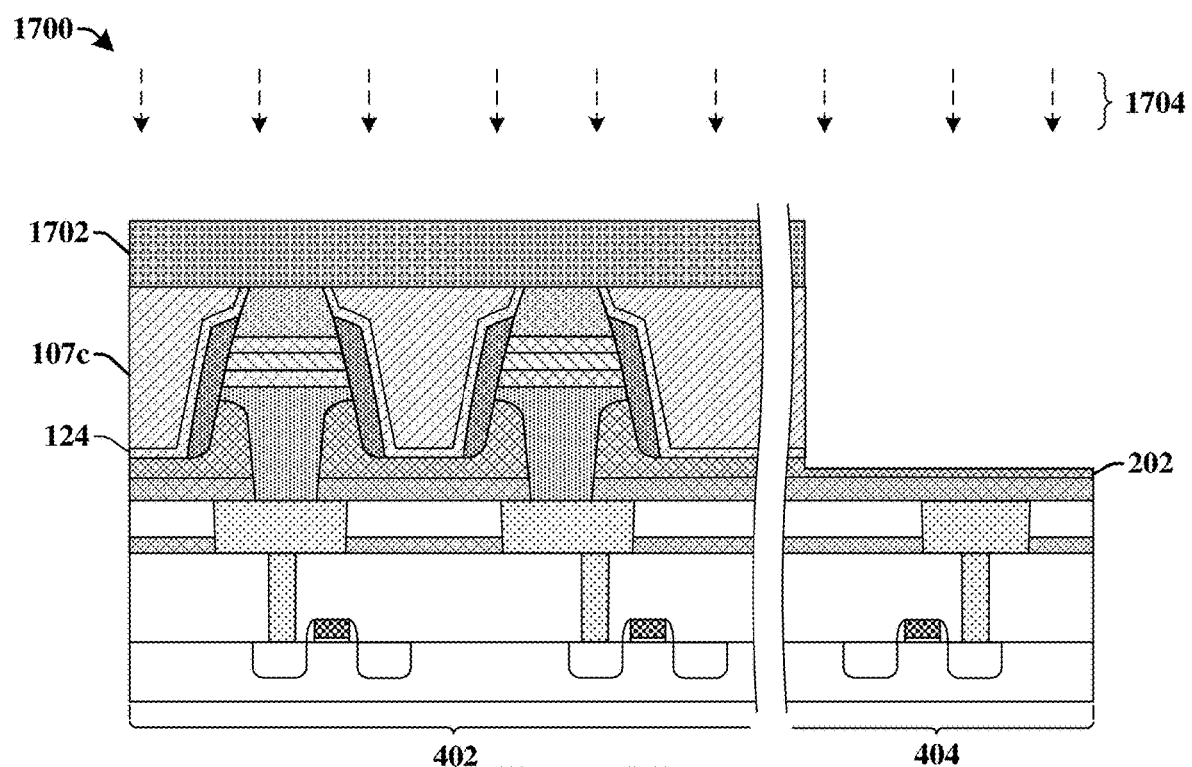

As shown in cross-sectional view 1700 of FIG. 17, the intermediate ILD layer 107c, the TEVA etch stop layer 124, and a part of the lower insulating structure 202 are removed from within the logic region 404. In some embodiments, a masking layer 1702 is formed over the intermediate ILD layer 107c within the embedded memory region 402. The intermediate ILD layer 107c is subsequently exposed to an etchant 1704 that etches the intermediate ILD layer 107c according to the masking layer 1702 to remove the intermediate ILD layer 107c from within the logic region 404. In some embodiments (not shown), the etching process may cause the intermediate ILD layer 107c to have an angled sidewall facing the logic region 404. In various embodiments, the masking layer 1702 may comprise one or more of silicon carbide, silicon nitride, or the like.

Figure 18:
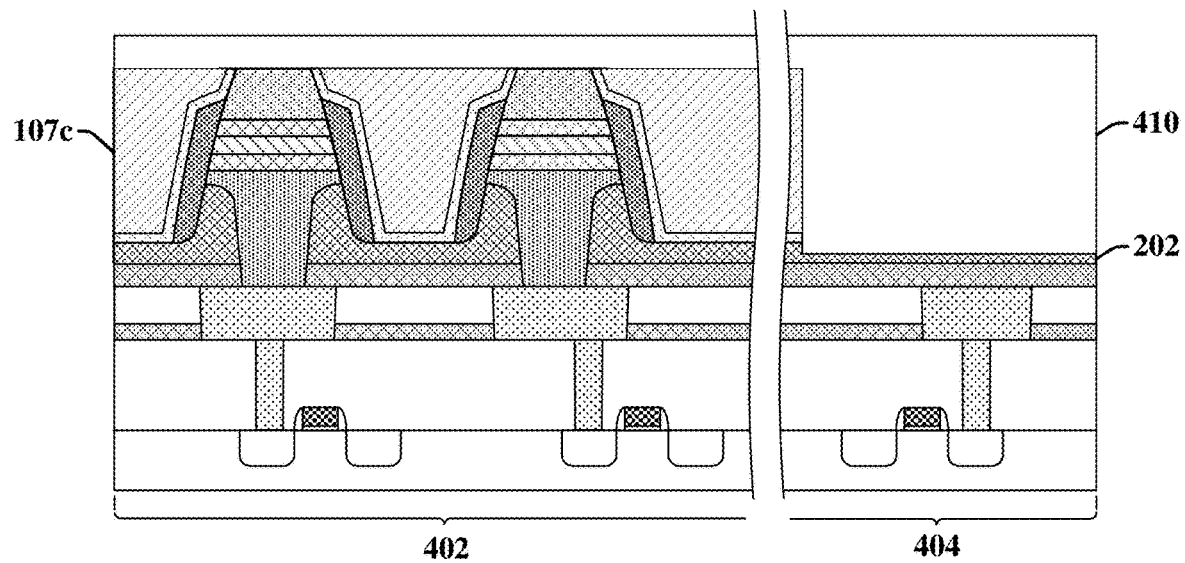

As shown in cross-sectional view 1800 of FIG. 18, a logic ILD layer 410 is formed over the intermediate ILD layer 107c within the embedded memory region 402 and over the lower insulating structure 202 within the logic region 404. In some embodiments, the logic ILD layer 410 may be deposited by a deposition process (e.g., PVD, CVD, PE-CVD, ALD, or the like). In various embodiments, the logic ILD layer 410 may comprise a different material than the intermediate ILD layer 107c. In some embodiments, wherein spaces between adjacent interconnect structures in the logic region 404 are larger than spaces between adjacent MTJ devices in the embedded memory region 402, the logic ILD layer 410 may comprise a material that has a lower dielectric constant and worse gap fill capabilities than the intermediate ILD layer 107c. In some embodiments, the logic ILD layer 410 may comprise silicon dioxide, carbon doped silicon dioxide, silicon oxynitride, borosilicate glass (BSG), phosphoric silicate glass (PSG), borophosphosilicate glass (BPSG), fluorinated silicate glass (FSG), a porous dielectric material, or the like.

Figure 19:
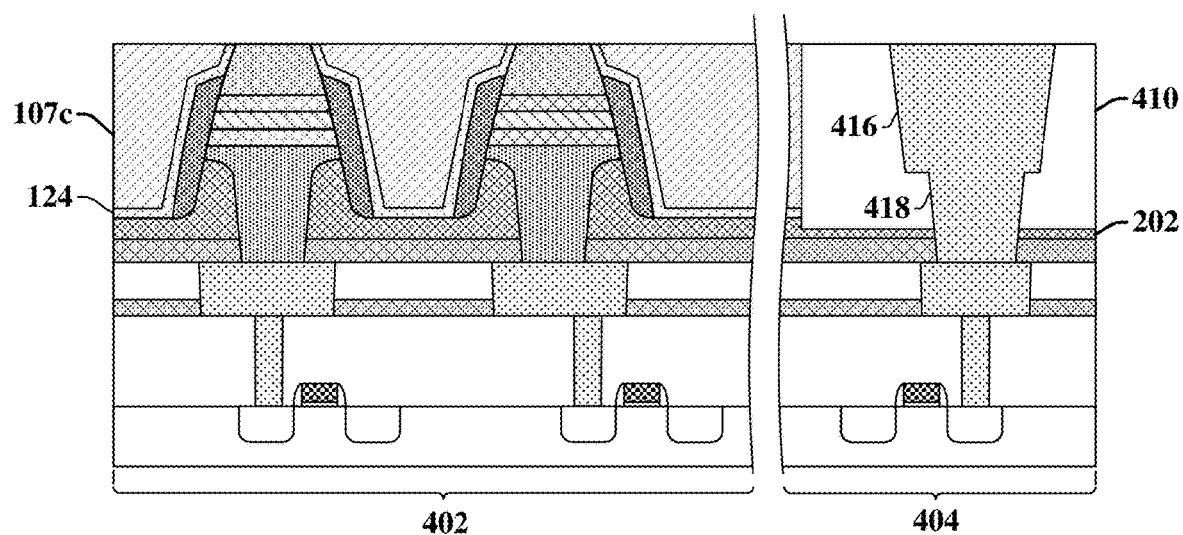

As shown in cross-sectional view 1900 of FIG. 19, one or more additional interconnect layers are formed within the logic ILD layer 410. In some embodiments, the one or more additional interconnect layers may comprise an interconnect via 418 and an interconnect wire 416. The one or more additional interconnect layers may be formed by selectively etching the logic ILD layer 410 to define a via hole and/or a trench within the logic ILD layer 410, forming a conductive material (e.g., copper, aluminum, etc.) within the via hole and/or a trench, and performing a planarization process (e.g., a chemical mechanical planarization process). In some embodiments, the planarization process removes the logic ILD layer 410 from over the intermediate ILD layer 107c. In some embodiments, the planarization process may comprise a chemical mechanical planarization (CMP) process.

Figure 20:
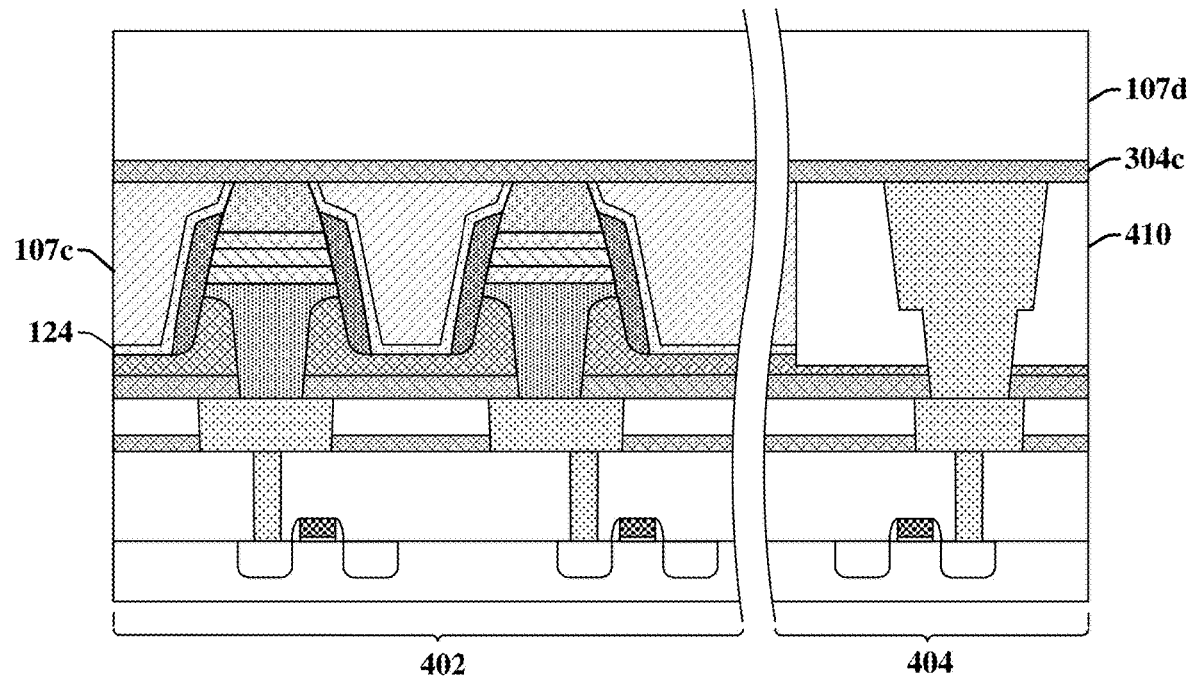

As shown in cross-sectional view 2000 of FIG. 20, an upper ILD structure 107d is formed over the intermediate ILD layer 107c within the embedded memory region 402 and over the logic ILD layer 410 within the logic region 404. In some embodiments, a third etch stop layer 304c may be formed onto the intermediate ILD layer 107c and the logic ILD layer 410 prior to the formation of the upper ILD structure 107d. In some embodiments, the upper ILD structure 107d may be deposited by a deposition process (e.g., PVD, CVD, PE-CVD, ALD, or the like). In some embodiments, the upper ILD structure 107d may comprise silicon dioxide, carbon doped silicon dioxide, silicon oxynitride, borosilicate glass (BSG), phosphoric silicate glass (PSG), borophosphosilicate glass (BPSG), fluorinated silicate glass (FSG), a porous dielectric material, or the like.

Figure 21:
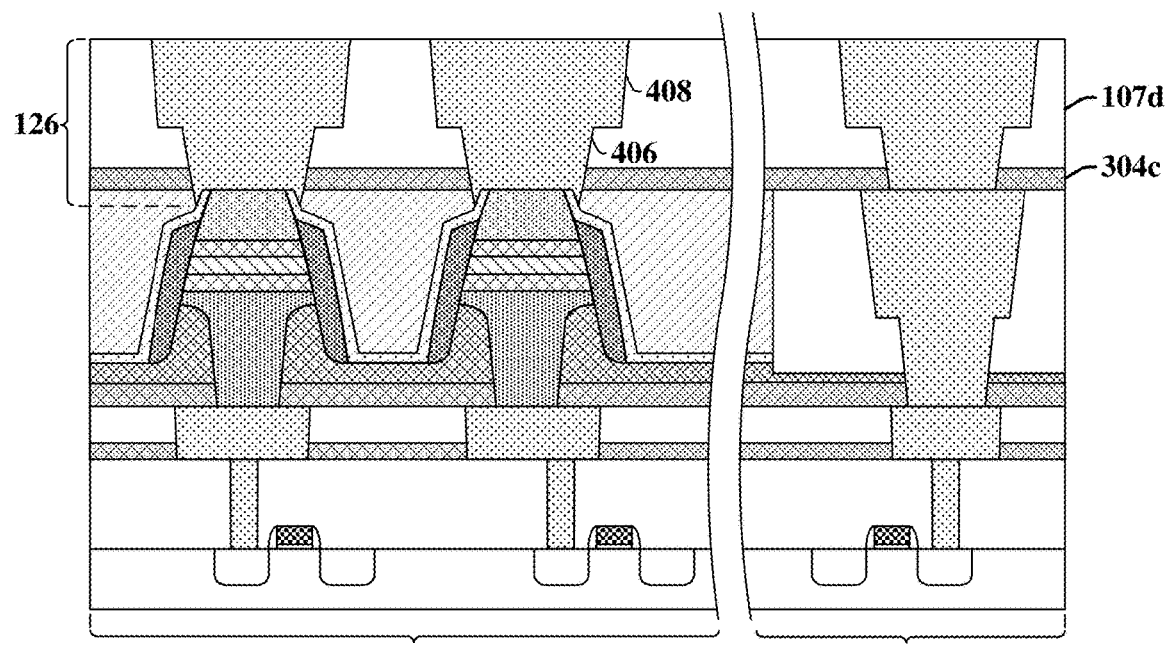

As shown in cross-sectional view 2100 of FIG. 21, an upper interconnect structure 126 is formed within the upper ILD structure 107d. In some embodiments, the upper interconnect structure 126 may comprise a top electrode via 406 disposed on the top electrode 120 of one of the MTJ devices 204a-204b, and an upper interconnect wire 408 vertically over the top electrode via 406 and laterally extending past one or more sides of the top electrode via 406. In some embodiments, the upper interconnect structure 126 may be formed by etching the upper ILD structure 107d to form a via hole and/or trench, which is filled with a conductive material (e.g., tungsten, copper, and/or aluminum). A chemical mechanical planarization (CMP) process is subsequently performed to remove excess of the conductive material from over the upper ILD structure 107d.

Figure 22:
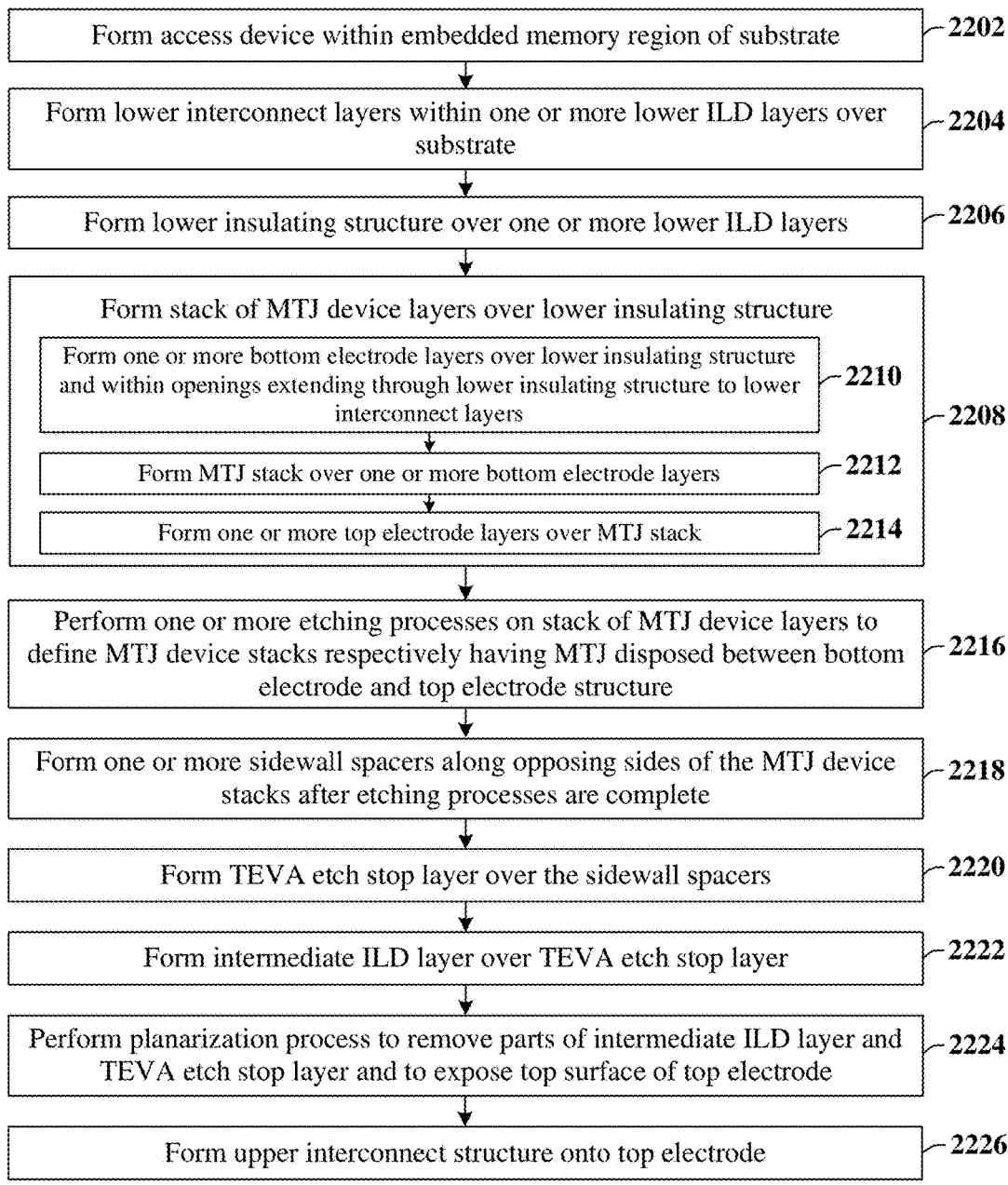
FIG. 22 illustrates a flow diagram of some embodiments of a method 2200 of forming a plurality of MTJ devices, which defines bottom electrodes of the MTJ devices prior to forming sidewall spacers along sides of the MTJ devices.

FIG. 22 illustrates a flow diagram of some embodiments of a method 2200 of forming a plurality of MTJ devices by defining bottom electrodes of the MTJ devices prior to forming sidewall spacers along sides of the MTJ devices.

While method 2200 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2202, an access device is formed within an embedded memory region of a substrate. FIG. 5 illustrates a cross-sectional view 500 of some embodiments corresponding to act 2202.

At 2204, lower interconnect layers are formed within one or more lower ILD layers over the substrate. In some embodiments, the lower interconnect layers are coupled to the access device. FIG. 6 illustrates a cross-sectional view 600 of some embodiments corresponding to act 2204.

At 2206, a lower insulating structure is formed over the one or more lower ILD layers. FIGS. 7-8 illustrate cross-sectional views 700-800 of some embodiments corresponding to act 2206.

At 2208, a stack of MTJ device layers is formed over the lower insulating structure. In some embodiments, the stack of MTJ device layers may be formed according to acts 2210-2214.

At 2210, one or more bottom electrode layers are formed over the lower insulating structure and within openings extending through the lower insulating structure to the lower interconnect layers. FIG. 9 illustrates a cross-sectional view 900 of some embodiments corresponding to act 2210.

At 2212, an MTJ stack is formed over the one or more bottom electrode layers. FIG. 10 illustrates a cross-sectional view 1000 of some embodiments corresponding to act 2212.

At 2214, one or more top electrode layers are formed over the MTJ stack. FIG. 10 illustrates a cross-sectional view 1000 of some embodiments corresponding to act 2214.

At 2216, one or more etching processes are performed on the stack of MTJ device layers to etch the one or more top electrode layers, the MTJ stack, and the bottom electrode structure and to define a plurality of MTJ device stacks respectively having a MTJ disposed between a bottom electrode and a top electrode structure. FIG. 11 illustrates a cross-sectional view 1100 of some embodiments corresponding to act 2216.

At 2218, one or more sidewall spacers are formed along sidewalls of the MTJ device stacks after the one or more etching processes are complete. In some embodiments, the sidewall spacers may extend to a sidewall of the lower insulating layer. FIGS. 12-13 illustrate cross-sectional views 1200-1300 of some embodiments corresponding to act 2218.

At 2220, a top electrode via (TEVA) etch stop layer is formed over the sidewall spacers. FIG. 14 illustrates a cross-sectional view 1400 of some embodiments corresponding to act 2220.

At 2222, an intermediate ILD layer is formed over the TEVA etch stop layer. FIG. 15 illustrates a cross-sectional view 1500 of some embodiments corresponding to act 2222.

At 2224, a planarization process is performed to remove parts of the intermediate ILD layer and the TEVA etch stop layer, and to expose a top surface of a top electrode. FIG. 16 illustrates a cross-sectional view 1600 of some embodiments corresponding to act 2224.

At 2226, an upper interconnect structure is formed onto the top electrode. FIGS. 20-21 illustrate cross-sectional views 2000-2100 of some embodiments corresponding to act 2226.

Accordingly, in some embodiments, the present disclosure relates to a method of forming an MTJ device that uses a single etching process to define a top electrode, an MTJ, and a bottom electrode. By using a single patterning process to define the MTJ device, a gap defining an etching area of a bottom electrode layer is increased.

In some embodiments, the present disclosure relates to an integrated chip. The integrated chip includes a dielectric structure disposed over a substrate; a plurality of lower interconnect layers disposed within the dielectric structure; a memory device having a data storage structure disposed between a bottom electrode and a top electrode, the bottom electrode electrically coupled to the plurality of lower interconnect layers; and a sidewall spacer continuously extending from an outermost sidewall of the data storage structure to below an outermost sidewall of the bottom electrode. In some embodiments, the sidewall spacer continuously extends from the outermost sidewall of the data storage structure to an outermost sidewall of the top electrode. In some embodiments, the sidewall spacer has an interior sidewall contacting the outermost sidewall of the data storage structure and the outermost sidewall of the bottom electrode. In some embodiments, the dielectric structure includes a plurality of lower inter-level dielectric (ILD) layers disposed over the substrate and surrounding the plurality of lower interconnect layers, an etch stop layer disposed over the plurality of lower ILD layers, and a lower insulating structure disposed over the etch stop layer, the bottom electrode extending from over the lower insulating structure to one of the plurality of lower interconnect layers. In some embodiments, the lower insulating structure has a greater thickness directly below the bottom electrode than laterally outside of the bottom electrode. In some embodiments, the interior sidewall of the sidewall spacer further contacts a sidewall of the lower insulating structure. In some embodiments, the integrated chip further includes a top electrode via etch stop layer that continuously extends from a sidewall of the sidewall spacer to an outermost sidewall of the top electrode. In some embodiments, the integrated chip further includes a second memory device having a second data storage structure disposed between a second bottom electrode and a second top electrode, the top electrode via etch stop layer continuously extending from a sidewall of the memory device to a sidewall of the second memory device. In some embodiments, the integrated chip further includes an upper interconnect structure disposed on the top electrode, the upper interconnect structure extending from over top electrode to along sides of the top electrode via etch stop layer. In some embodiments, a horizontal line extending along a bottom of the top electrode via etch stop layer also extends through sidewalls of the lower insulating structure, the horizontal line is parallel to a bottom surface of the bottom electrode. In some embodiments, the bottom electrode has a bottom surface with a first width and a top surface with a second width that is larger than the first width; and the sidewall spacer has a bottom surface disposed along a horizontal line that is between the top surface and the bottom surface.

In other embodiments, the present disclosure relates to an integrated chip. The integrated chip includes a lower inter-level dielectric (ILD) layer disposed over a substrate; a lower interconnect layer disposed within the lower ILD layer; a lower insulating structure disposed over the lower ILD layer; a magnetic tunnel junction (MTJ) device having an MTJ disposed between a bottom electrode and a top electrode, the bottom electrode arranged on the lower interconnect layer and extending through the lower insulating structure; and a top electrode via etch stop layer continuously extending from an outermost sidewall of the top electrode to below an outermost sidewall of the bottom electrode. In some embodiments, the integrated chip further includes a sidewall spacer completely covering the outermost sidewall of the bottom electrode and an outermost sidewall of the MTJ. In some embodiments, the sidewall spacer contacts the outermost sidewall of the MTJ, the outermost sidewall of the bottom electrode, and a sidewall of the lower insulating structure. In some embodiments, the top electrode via etch stop layer has a vertically extending segment protruding outward from a top surface of a horizontally extending segment, the vertically extending segment extending along a sidewall of the sidewall spacer to a horizontal line that is parallel to and disposed along a top surface of the top electrode. In some embodiments, the integrated chip further includes an intermediate ILD layer laterally surrounding the MTJ device, the top electrode via etch stop layer having an upper surface facing away from the substrate and contacting a lower surface of the intermediate ILD layer. In some embodiments, the integrated chip further includes an intermediate ILD layer laterally surrounding the MTJ device and laterally separated from the MTJ device by way of the top electrode via etch stop layer, the top electrode via etch stop layer continuously extending from directly below the intermediate ILD layer to a horizontal line that is parallel to and disposed along a top surface of the top electrode.

In yet other embodiments, the present disclosure relates to a method of forming an integrated chip. The method includes forming a lower interconnect layer within a lower inter-level dielectric (ILD) layer over a substrate; forming one or more bottom electrode layers over the lower interconnect layer; forming a magnetic tunnel junction (MTJ) stack over the one or more bottom electrode layers; forming one or more top electrode layers over the MTJ stack; performing one or more etching processes to selectively pattern the one or more top electrode layers, the MTJ stack, and the one or more bottom electrode layers, and to define a top electrode structure, an MTJ, and a bottom electrode; and forming a sidewall spacer along outermost sidewalls of the MTJ and the bottom electrode after the one or more etching processes are complete. In some embodiments, the method further includes forming a lower insulating structure over the lower ILD layer; etching the lower insulating structure to form first sidewalls of the lower insulating structure that define opening that exposes the lower interconnect layer; forming the one or more bottom electrode layers within the opening and over the lower insulating structure; and forming the sidewall spacer along second sidewalls of the lower insulating structure after the one or more etching processes are complete. In some embodiments, the method further includes forming a top electrode via etch stop layer onto a vertically extending surface of the sidewall spacer and onto a horizontally extending surface of the lower insulating structure; forming an upper ILD layer over the top electrode via etch stop layer; and performing a planarization process to remove part of the upper ILD layer, the top electrode via etch stop layer, and the top electrode structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first dielectric layer;
   a bottom electrode at least partially arranged within the first dielectric layer;
   a memory element over the bottom electrode;
   a top electrode over the memory element;
   a sidewall spacer continuously extending from an outermost sidewall of the memory element to below an outermost sidewall of the bottom electrode;
   a second memory element disposed between a second bottom electrode and a second top electrode;
   a second sidewall spacer continuously extending from an outermost sidewall of the second memory element to below an outermost sidewall of the second bottom electrode;
   an etch stop layer extending along sidewalls of the sidewall spacer and the second sidewall spacer, wherein the etch stop layer has a first thickness between the memory element and the second memory element and a second thickness along an outermost sidewall of the etch stop layer, the second thickness being substantially equal to the first thickness; and
   a second dielectric layer over the etch stop layer, the second dielectric layer surrounding the memory element and at least a part of the top electrode.

2. The semiconductor device of claim 1, wherein the bottom electrode comprises top and bottom surfaces that have different widths.

3. The semiconductor device of claim 1, wherein the bottom electrode protrudes outward from directly between sidewalls of the first dielectric layer to vertically above the first dielectric layer.

4. The semiconductor device of claim 1, wherein the top electrode has a top surface that is above a top surface of the second dielectric layer.

5. The semiconductor device of claim 1, wherein the second dielectric layer laterally extends past the sidewall of the sidewall spacer.

6. The semiconductor device of claim 1, further comprising:
   a top electrode via contacting the top electrode and comprising a horizontally extending surface that is directly over the sidewall spacer, wherein the top electrode via further comprises a sidewall extending outward from the horizontally extending surface at a location that is directly over the sidewall spacer.

7. The semiconductor device of claim 1, wherein the bottom electrode has a first maximum width that is larger than a second maximum width of the top electrode.

8. The semiconductor device of claim 1,
   wherein the first dielectric layer has a first non-zero thickness directly below the bottom electrode, a second non-zero thickness laterally outside of the bottom electrode and below the second dielectric layer, and a third non-zero thickness below a third dielectric layer laterally adjacent to the second dielectric layer; and
   wherein the first non-zero thickness is greater than the second non-zero thickness and the second non-zero thickness is larger than the third non-zero thickness.

9. A semiconductor device, comprising:
   a first dielectric layer;
   a bottom electrode at least partially arranged within the first dielectric layer;

a memory element arranged over the bottom electrode;

a top electrode arranged over the memory element;

a sidewall spacer continuously extending from an outermost sidewall of the memory element to below an outermost sidewall of the bottom electrode;

an etch stop layer extending along a sidewall of the sidewall spacer, wherein the etch stop layer comprises an outermost sidewall aligned with a sidewall of the first dielectric layer that is directly over the first dielectric layer;

a second dielectric layer arranged over at least a first region of the first dielectric layer, the second dielectric layer surrounding the memory element and at least a part of the top electrode;

a third dielectric layer arranged over a second region of the first dielectric layer and laterally adjacent to the second dielectric layer;

a conductive interconnect arranged in the third dielectric layer and the second region of the first dielectric layer; and an additional dielectric layer surrounding the bottom electrode and extending from the first region to the second region, the additional dielectric layer completely covered by the first dielectric layer.

10. The semiconductor device of claim 9, wherein the second dielectric layer has a sloped sidewall facing the third dielectric layer, the sloped sidewall being oriented at an obtuse angle with respect to a horizontally extending line extending along a bottom of the third dielectric layer as measured along an angle that is outside of the second dielectric layer.

11. The semiconductor device of claim 9, wherein the third dielectric layer has a bottommost surface that is directly over the first dielectric layer.

12. A semiconductor device, comprising:

a first dielectric layer having a first region and a second region;

a bottom electrode at least partially arranged within the first region of the first dielectric layer;

a data storage structure arranged over the bottom electrode;

a top electrode arranged over the data storage structure;

a second dielectric layer arranged over at least the first region of the first dielectric layer, the second dielectric layer surrounding the data storage structure and surrounding at least a part of the top electrode;

a third dielectric layer arranged over the second region of the first dielectric layer and laterally next to the second dielectric layer, wherein the third dielectric layer has a bottommost surface that is over a bottommost surface of the first dielectric layer;

a conductive interconnect arranged in the third dielectric layer and the second region of the first dielectric layer;

a sidewall spacer continuously extending from an outermost sidewall of the data storage structure to below an outermost sidewall of the bottom electrode; and an etch stop layer disposed over the sidewall spacer and continuously extending from an outermost sidewall of the top electrode to below the outermost sidewall of the bottom electrode, wherein the etch stop layer comprises aluminum oxide.

13. The semiconductor device of claim 12, wherein the third dielectric layer laterally contacts an outermost sidewall of the etch stop layer and a sidewall of the first dielectric layer that is directly over the first dielectric layer.

14. The semiconductor device of claim 12, wherein the etch stop layer extends to a non-zero distance below a bottom of the sidewall spacer.

15. The semiconductor device of claim 12, wherein the etch stop layer has a sidewall that laterally contacts a sidewall of the first dielectric layer.

16. The semiconductor device of claim 12, wherein the etch stop layer has a lower sidewall arranged along sides of the bottom electrode and the data storage structure and an upper sidewall arranged over the lower sidewall, the upper sidewall being laterally offset from the lower sidewall.

17. The semiconductor device of claim 12, wherein the data storage structure comprises a magnetic tunnel junction or a high-k dielectric material.

18. The semiconductor device of claim 9, wherein the etch stop layer vertically straddles a bottommost surface of the sidewall spacer.

19. The semiconductor device of claim 9, wherein the bottom electrode comprises a curved surface facing the first dielectric layer.

20. The semiconductor device of claim 9, wherein the bottom electrode has a concave surface that faces the first dielectric layer in a cross-sectional view.

* * * * *